United States Patent [19]

Moriya et al.

[11] Patent Number: 4,597,167

[45] Date of Patent: Jul. 1, 1986

[54] METHOD OF FORMING A METAL FILM ON A SELECTIVELY DIFFUSED LAYER

[75] Inventors: Takahiko Moriya, Yokosuka; Saburo Nakada, Kawasaki, both of Japan

[73] Assignee: Kabushiki Kaisha Toshiba, Kawasaki, Japan

[21] Appl. No.: 641,191

[22] Filed: Aug. 16, 1984

[30] Foreign Application Priority Data

Aug. 30, 1983 [JP] Japan ................ 58-158713

[51] Int. Cl.[4] .............. H01L 21/225; H01L 21/285
[52] U.S. Cl. ...................... 29/590; 29/578; 29/591; 148/DIG. 19; 148/DIG. 20; 148/DIG. 26; 357/65; 427/88; 427/91
[58] Field of Search ............... 29/590–594, 29/578; 427/84, 88, 91; 357/65; 148/DIG. 19, DIG. 20, DIG. 26, DIG. 139

[56] References Cited

U.S. PATENT DOCUMENTS

| | | | |
|---|---|---|---|
| 3,619,288 | 11/1971 | Sirtl | 427/91 |
| 3,801,365 | 4/1974 | Hrzek | 427/91 |
| 4,313,971 | 2/1982 | Wheatley | 427/84 |
| 4,343,676 | 8/1982 | Tarng | 29/591 X |
| 4,349,408 | 9/1982 | Tarng et al. | 29/590 X |
| 4,404,235 | 9/1983 | Tarng et al. | 427/91 X |
| 4,517,225 | 5/1985 | Broadbent | 427/91 X |
| 4,532,702 | 8/1985 | Gigante et al. | 29/578 |

FOREIGN PATENT DOCUMENTS 5776833 5/1982 Japan .

OTHER PUBLICATIONS

Shaw et al., "Vapor-Deposited Tungsten-Interconnection-Devices", R.C.A. Review, Jun. 1970, pp. 306–316.
Miller et al., "Hot-Wall CVD Tungsten for VLSI", Solid State Technology, Dec. 1980, pp. 79–82.

Primary Examiner—William G. Saba
Attorney, Agent, or Firm—Oblon, Fisher, Spivak, McClelland & Maier

[57] ABSTRACT

A method of producing a semiconductor device, including the steps of introducing an impurity of one conductivity type into a semiconductor substrate of an opposite conductivity type having an insulating film pattern formed on a surface thereof, using the insulating film pattern as a mask to form a diffusion layer; and forming a metal film on the diffusion layer by selective vapor growth with a mixture of a metal source gas and a carrier gas used as a feed gas. The vapor growth is carried out such that the distance of entry of the metal film from the edge of the insulating film pattern to the interface between the insulating film pattern and the diffusion layer is smaller than the depth of the pn junction of the diffusion layer. The particular method makes it possible to achieve a selective vapor growth of a metal film on the diffusion layer without deteriorating the pn junction characteristics.

4 Claims, 7 Drawing Figures

METHOD OF FORMING A METAL FILM ON A SELECTIVELY DIFFUSED LAYER

BACKGROUND OF THE INVENTION

The present invention relates to a method of producing a semiconductor device, particularly, to a method of selectively forming a metal film on the surface of a semiconductor layer by a selective vapor growth technique.

Polycrystalline silicon (polysilicon) is widely used as the material of the gate electrode and interconnection electrode of a MOS type integrated circuit. However, polysilicon, even if doped with an impurity such as phosphorus, has a resistivity 100 times or more as high as that of a metal such as Al, with the result that a further improvement in the operation speed of an integrated circuit is obstructed by the use of polysilicon. Also, the recent miniaturization of the element is accompanied by a decrease in the junction depth, leading to a high resistance of the diffusion layer such as the source or drain region. The high operation speed of the integrated circuit is also obstructed by the high resistance of the diffusion layer mentioned above.

Recently, it is attempted to selectively form a metal film having a low resistivity on an electrode formed of polysilicon or on a semiconductor layer doped with an impurity, e.g. on a diffusion layer, by means of a vapor growth method. For example, a tungsten (W) film is selectively formed on a silicon or polysilicon layer by a vapor growth method using tungsten hexafluoride as the feed gas.

However, where a W layer is selectively grown on a diffusion layer formed in the surface region of a silicon substrate using, for example, an oxide film as a mask, a remarkable leak current takes place in the pn junction between the diffusion layer and the substrate, leading in some cases to a short circuiting. The deterioration of the junction property is rendered more serious as the junction depth is decreased. Thus, it is difficult to apply the above-noted method to a diffusion layer having a junction depth of 0.2 μm or less.

SUMMARY OF THE INVENTION

An object of the present invention is to provide a method of producing a semiconductor device, comprising a vapor growth deposition step which permits a selective growth of a metal film even on a semiconductor layer having a shallow pn junction without deteriorating the junction characteristics.

As a result of extensive research on the abovenoted conventional vapor growth deposition method of a metal film, the inventors have found that, in the vapor growth of a metal film on a diffusion layer formed in a semiconductor substrate with an insulating film used as a mask, the metal film extends from the edge of the insulating film to reach the interface between the insulating film and the diffusion layer, leading to a deterioration of the junction characteristics. The present invention has been achieved on the basis of this finding.

According to the present invention, there is provided a method of producing a semiconductor device, comprising the steps of:

introducing an impurity of one conductivity type into a semiconductor substrate of the opposite conductivity type having an insulating film pattern formed on the surface, with the insulating film pattern used as a mask, to form a diffusion layer; and forming a metal film on the diffusion layer by vapor growth, said vapor growth being carried out such that the distance of entry of the metal film from the edge of the insulating film pattern to the interface between the insulating film pattern and the diffusion layer is smaller than the depth of the pn junction of the diffusion layer.

The desired vapor growth can be achieved by controlling the substrate temperature and the concentration of the metal source gas. Specifically, the substrate temperature should be 200° to 400° C., and the molar ratio of the carrier gas to the metal source gas should be at least 50. Also, the flow rate of the metal source gas should desirably be 10 cc/min or less. A metal fluoride gas such as $WF_6$ or $MoF_6$ is used as the metal source gas. On the other hand, a $H_2$ gas as well as an inert gas such as Ar or He, or a mixture of $H_2$ gas and an inert gas is used as the carrier gas.

In the present invention, the insulating film pattern is used not only as a mask for introducing an impurity but also as a mask for the selective vapor growth of a metal. The insulating film pattern may be formed by patterning a silicon dioxide film formed on the semiconductor substrate. Alternatively, selective oxidation may be applied to a silicon substrate using a silicon nitride film pattern formed on the substrate as a mask. Further, the grooves formed on the substrate surface may be filled with an insulating material by a vapor growth method so as to form the desired insulating film pattern.

The diffusion layer may be formed by introducing As into a p-type silicon substrate. Alternatively, B (boron) may be introduced into an n-type silicon substrate to form the diffusion layer in the substrate.

The substrate used in the present invention is not restricted to a silicon substrate. For example, a compound semiconductor substrate such as GaAs may also be used in the present invention.

The method of the present invention makes it possible to selectively form a metal film on the surface of a diffusion layer without deteriorating the pn junction characteristics, leading to the production of a semiconductor device of a high reliability having a shallow pn junction and a diffusion layer of a low resistance.

DETAILED DESCRIPTION OF THE PREFERRED EMBODIMENT

The following Experiment was conducted in order to determine the vapor growth condition employed in the method of the present invention.

EXPERIMENT

Figure 1:
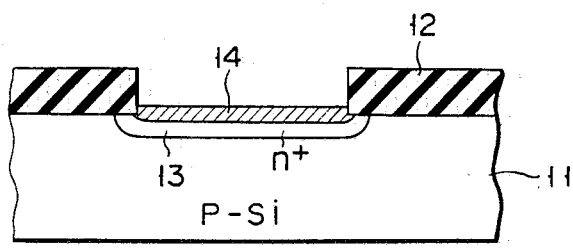
FIG. 1 is a cross-sectional view showing a semiconductor substrate provided with a diffusion layer having a metal film formed on the surface, said substrate used in the Experiment described herein.
Figure 2:
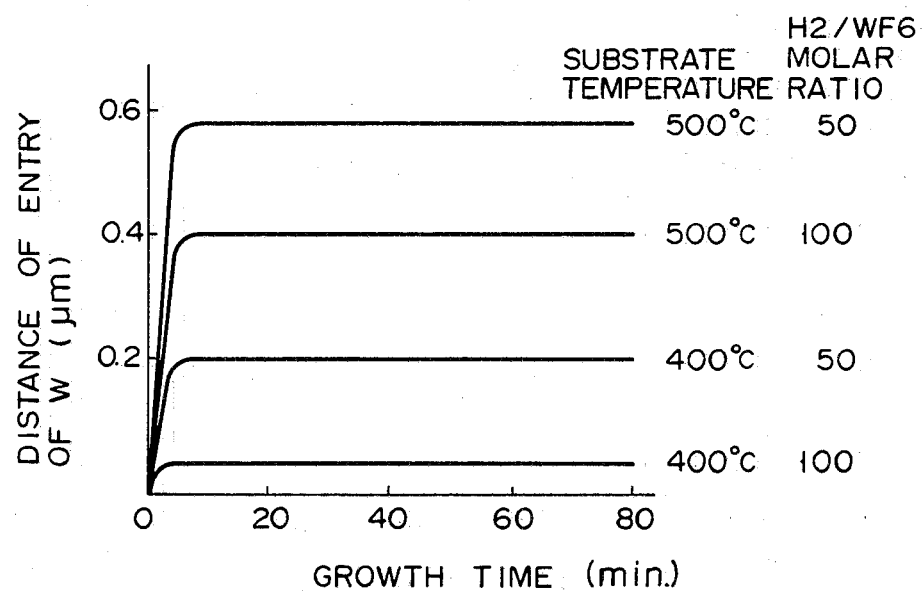
FIG. 2 is a graph showing the relationship between the vapor growth time and the distance of W entry.

As shown in FIG. 1, a desired pattern of SiO$_2$ film 12 was formed on the surface of a p-type silicon substrate 11, followed by diffusing As (arsenic) into the exposed substrate 11 to form an n$^+$-type diffusion layer 13 having a pn junction depth of 0.1 to 0.3 μm. Then, a W film 14 having a thickness of 300 to 1,300 Å was selectively grown on the surface of the n$^+$-type diffusion layer 13 by a vapor growth method using a mixture of a WF$_6$ gas and a H$_2$ gas as the feed gas. A low pressure vapor growth apparatus of a diffusion furnace type was used for the vapor growth. The pressure within the reaction chamber for the vapor growth was set at 0.1 Torr. Also, the total flow rate of WF$_6$ and H$_2$ was set at 200 cc/min. FIG. 2 shows the distance of entry with time of the W film 14 from the edge of the SiO$_2$ film 12 facing the opening made in the film 12 to the interface between the Si substrate and the SiO$_2$ film, covering the cases where the substrate temperature was set at 150° to 800° C. and the H$_2$/WF$_6$ molar ratio at 10 to 1,000.

As apparent from FIG. 2, the W entry takes place in the initial stage of the W film growth and reaches saturation only several minutes after initiation. In the initial stage of the vapor growth during which the grown W film is very thin, a large amount of Si is thought to be consumed by the substitution reaction between WF$_6$ and Si, with the result that a clearance is formed in the interface between the Si substrate and the SiO$_2$ layer. Naturally, W is thought to enter the clearance. Several minutes after initiation of the vapor growth, however, the W film is thought to grow thick enough to fill the clearance mentioned above. In other words, the W entry in question is thought to reach saturation. FIG. 2 shows that the distance of the W entry is promoted as the substrate temperature is increased. Also, the W entry is increased in proportion to the decrease in the H$_2$/WF$_6$ molar ratio, i.e., the increase in the WF$_6$ concentration.

Where the junction depth of the n$^+$-type diffusion layer 13 shown in FIG. 1 is 0.2 μm, the lateral distance between the edge of the SiO$_2$ film 12 facing the opening made in the film 12 and the junction is also 0.2 μm. Thus, the distance of the W entry should be made 0.2 μm or less in order to prevent the short-circuiting of the junction. It follows that the substrate temperature should be set at 400° C. or less and that the H2/WF$_6$ molar ratio should be set at 50 or more in order to prevent the short-circuiting of the pn junction, as apparent from FIG. 2.

Figure 3:
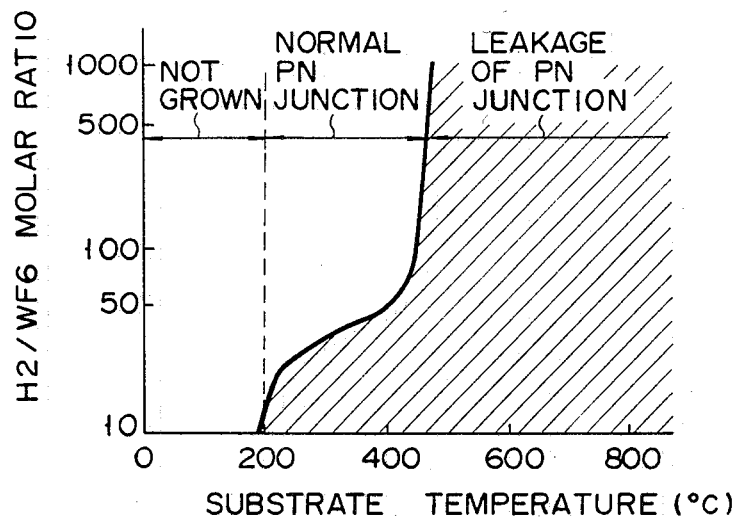
FIG. 3 shows the pn junction characteristics relative to the substrate temperature and the $H_2/WF_6$ molar ratio.

FIG. 3 shows the pn junction characteristics relative to the substrate temperature and the H$_2$/WF$_6$ molar ratio covering the case where the W film 14 is formed by vapor growth on the n$^+$-type diffusion layer 13 having the minimum junction depth of 0.1 to 0.2 μm. It should be noted that a W film is not grown if the substrate temperature is lower than 200° C. As apparent from FIG. 3, the substrate temperature should be 200° to 400° C. and the H$_2$/WF$_6$ molar ratio should be at least 50 in order to grow a W film and to obtain the normal pn junction characteristics. Naturally, the normal pn junction characteristics can be obtained under the substrate temperature and the H$_2$/WF$_6$ molar ratio specified above even if the junction depth is more than 0.2 μm.

The present invention can be more fully understood from the Example described in the following with reference to FIGS. 4A to 4D.

EXAMPLE

Figure 4A:
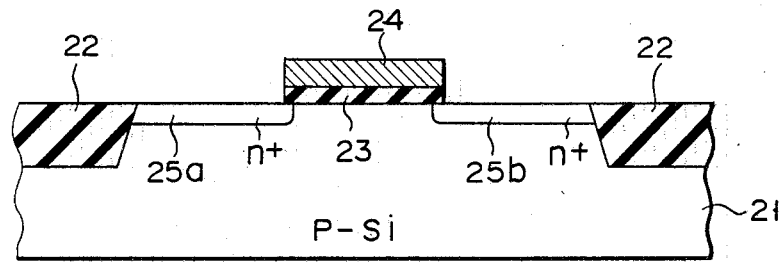
FIGS. 4A to 4D are cross-sectional views collectively showing a method of producing a MOS type semiconductor device according to one embodiment of the present invention.
Figure 4B:
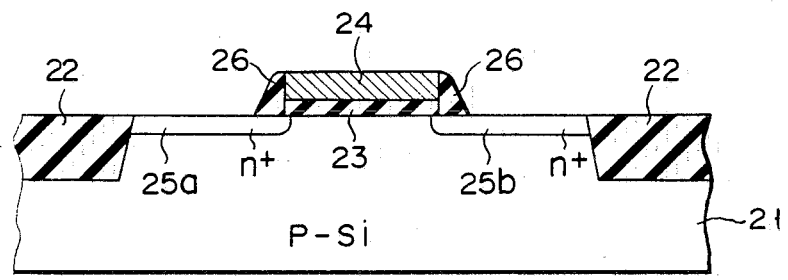
Figure 4C:
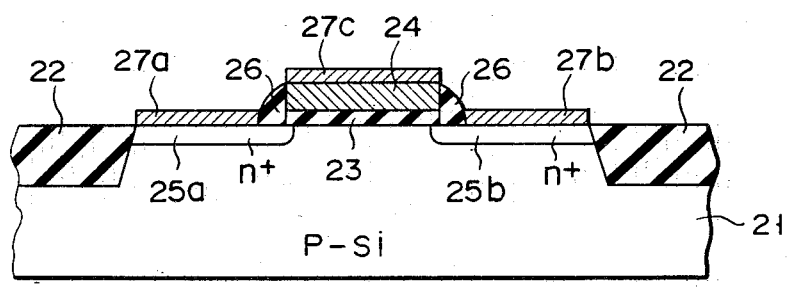
Figure 4D:
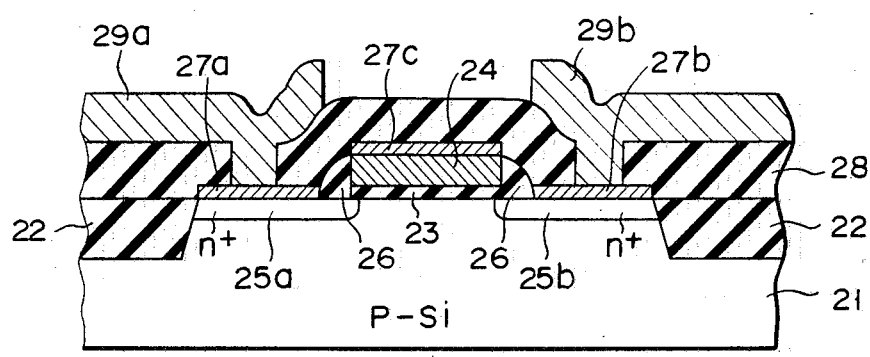

As seen from FIG. 4A, a field oxide film 22 was formed on a p-type Si substrate 21. Then, a gate oxide film 23 and a gate electrode 24 consisting of poly-Si or metal silicide were formed on the substrate 21, followed by introducing As into the substrate 21 by ion implantation so as to form n$^+$-type diffusion layers 25a and 25b forming source and drain regions, respectively, having a junction depth of 0.15 μm. After formation of the diffusion layers 25a and 25b, a SiO$_2$ film 26 was deposited on the entire surface, followed by applying an anisotropic etching to the SiO$_2$ film 26 so as to selectively leave the SiO$_2$ film 26 on the side walls of the gate electrode as shown in FIG. 4B. Further, W films 27a, 27b and 27c were selectively grown on the surfaces of the n$^+$-type diffusion layers 25a, 25b and the gate electrode 24 by a low pressure vapor growth method using a mixture of WF$_6$ and H$_2$ as the feed gas (FIG. 4C). Vapor growth was carried out under a substrate temperature of 350° C., a H$_2$/WF$_6$ molar ratio of 100, and a reaction chamber inner pressure of 0.2 Torr. After vapor growth, a SiO$_2$ film 28 was deposited on the entire surface by a plasma CVD method using a mixture of N$_2$O and SiH$_4$ as the feed gas. Then, contact holes were made in the SiO$_2$ film 28, followed by forming Al layers 29a, 29b as shown in FIG. 4D.

The resultant MOSFET was found to be free of deterioration in the junction characteristic regardless of the very shallow pn junction formed therein. Also, the MOSFET exhibited an excellent operation performance because W layers were formed on the surfaces of the shallow diffusion layers and the gate electrode to reduce the resistance thereof.

What is claimed is:

1. A method of manufacturing a semiconductor device, comprising the steps of:
   introducing an impurity of one conductivity type into a semiconductor substrate of an opposite conductivity type having an insulating film formed on a surface thereof, using the insulating film pattern as a mask to form a diffusion layer; and
   forming a metal film on the diffusion layer by selective vapor growth with a mixture of a metal source gas and a carrier gas used as a feed gas, said carrier gas being at least one member selected from the group consisting of a hydrogen gas and an inert gas, and said vapor growth being carried out under the condition that the substrate temperature is 200° to 400° C., and the molar ratio of the carrier gas to the metal source gas is at least 50, whereby the distance of entry of the metal film from the edge of the insulating film pattern to the interface between the insulating film pattern and the diffusion layer is smaller than the depth of the pn junction of the diffusion layer.

2. The method according to claim 1, wherein the flow rate of the metal source gas is 10 cc/min or less.

3. The method according to claim 1, wherein the insulating film pattern consists of SiO$_2$.

4. The method according to claim 1, wherein the vapor growth is carried out under a reduced pressure.

* * * * *